United States Patent [19]

Da Costa

[11] Patent Number: 5,073,723
[45] Date of Patent: Dec. 17, 1991

[54] SPACE CHARGE CURRENT LIMITED SHUNT IN A CASCODE CIRCUIT FOR HVTFT DEVICES

[75] Inventor: Victor M. Da Costa, San Carlos, Calif.

[73] Assignee: Xerox Corporation, Stamford, Conn.

[21] Appl. No.: 565,767

[22] Filed: Aug. 10, 1990

[51] Int. Cl.$^5$ .................. H03K 17/84; H03K 19/12
[52] U.S. Cl. ............................ 307/298; 307/448; 307/450; 307/303.2; 307/304; 357/23.7; 357/23.8
[58] Field of Search .............. 307/448, 450, 303.2, 307/304, 298; 357/23.7-23.8

[56] References Cited
U.S. PATENT DOCUMENTS 4,623,908 11/1986 Oshima et al. .................. 357/23.8
4,792,210 12/1988 Maurice ............................ 357/23.7
4,862,237 8/1989 Morozumi ........................ 357/23.7
4,960,719 10/1990 Tanaka et al. .................... 357/23.7
4,998,146 3/1991 Hack ................................ 357/23.7
5,003,356 3/1991 Wakai et al. ..................... 357/23.7

Primary Examiner—Stanley D. Miller
Assistant Examiner—Margaret Rose Wambach
Attorney, Agent, or Firm—Serge Abend

[57] ABSTRACT

A cascode circuit for switching a high voltage thin film transistor substantially over its entire high voltage range, comprising a leaky low voltage thin film transistor connected in series with the high voltage thin film transistor, the transistors being connected between a source of high potential and a source of reference potential, and the leaky low voltage thin film transistor includes a space charge limited current shunt connected in parallel with the low voltage thin film transistor.

10 Claims, 5 Drawing Sheets

SPACE CHARGE CURRENT LIMITED SHUNT IN A CASCODE CIRCUIT FOR HVTFT DEVICES

FIELD OF THE INVENTION

This invention relates to an improved circuit for switching an amorphous silicon high voltage thin film transistor (HVTFT) substantially over its full range in an efficient and stable manner. More particularly, it relates to a cascode circuit including a space charge current limited shunt.

BACKGROUND OF THE INVENTION

High speed switching of high voltage thin film transistors is severely limited by capacitance between the transistor terminals. This parasitic capacitance limits the speed at which the voltages within a circuit can swing can and can prevent the HVTFT from fully switching over its entire voltage range in the time allotted therefor.

An example of a typical high voltage circuit application subject to this problem is the resistive inverter circuit used in the electrographic writing head 10 schematically illustrated in FIG. 1. Such a writing head, manufacturable by thin film fabrication techniques, is fully disclosed in U.S. Pat. No. 4,588,997. The writing head 10 comprises a linear array of several thousand styli 12 for generating sequential raster lines of information by means of high voltage electrical discharges across a minute air gap to a conductive electrode. In order to drive selected styli in the array, a multiplexing scheme is used wherein the charge on each stylus is controlled by a low voltage thin film pass transistor (LVTFT) 14 which selectively charges and discharges the gate of a thin film high voltage transistor 16 for switching the HVTFT. This scheme allows each stylus to maintain its imposed charge, for substantially a line time, between charges and discharges. The drain electrode 18 of HVTFT 16 is connected to high voltage bus 20 (maintained at about 450 volts relative to ground) via load resistor 22, and its source electrode 24 is connected to ground bus 26. Data signals, from data lines 28, on the order of 20 volts (ON) and 0 volts (OFF) will be imposed upon the gate electrode of the HVTFT when the address line 30 switches the gate of LVTFT 14 between about 24 volts (ON) and 0 volts (OFF) during a "gate time" of about 15 to 25 μsec, i.e. the time it takes for the gate of the HVTFT to reach its desired potential.

Writing takes place in electrography when the potential difference between the stylus 12 and a biased complementary electrode (not shown) is sufficient to break down the air gap therebetween. In one form of this art, the complementary electrode is biased to a potential of several hundred volts. In the ON state of the HVTFT 16 writing will take place because the stylus will achieve a low potential so that the difference between it and the complementary electrode is high enough to cause air gap breakdown. When the HVTFT is ON, a current path exists from the high voltage bus 20 to ground through the HVTFT, and the large voltage drop across the load resistor 22 will cause the potential on the stylus 12 to approach ground (typically about 10 volts). In the OFF state of the HVTFT no writing will occur because no current path exists from the high voltage bus to ground, there will be no potential drop across the load resistor, and a high potential (of about 450 volts) will be applied to the stylus 12.

A switching problem arises with this circuit because of the parasitic capacitance between the drain electrode 18 and the gate electrode 32 of the HVTFT induced by the rapid switching of the LVTFT during a gate time. Reference is now made to single cell stylus driver circuit, shown in FIG. 2, wherein the parasitic capacitance is represented by the capacitor 34 (shown in dotted lines). In operation of the writing head, the LVTFT 14 is rapidly switched to change the state of the HVTFT 16, after which the potential on the gate electrode 32 will float until it is next addressed. As indicated above, when the HVTFT is ON, its drain electrode 18 will be at a low potential (about 10 volts) and its gate electrode 32 will be floating at about 20 volts. When turning OFF the HVTFT, its gate electrode will be rapidly discharged to about 0 volts during the 15 to 25 μsec gate time. However, it typically takes about 150 to 200 μsec to swing its drain from its low voltage value of 10 volts to its high voltage value of 450 volts. Thus, most of this transition occurs well after the LVTFT has switched OFF and the gate electrode is floating. Because the drain and the gate are capacitively coupled, as the drain potential rises the gate potential is pulled up with it until the HVTFT turns marginally ON and reaches a value sufficient to stop the drain potential from increasing further. The result is that the switching efficiency is poor and the drain electrode (and the stylus) will achieve only about 200 to 250 volts rather than the intended 450 volts because the HVTFT doesn't turn fully OFF and the stylus will write gray rather than white (non-white).

One way to overcome this problem is to write the same data to the HVTFTs in two consecutive passes so that by double pulsing every line the write signal will first achieve about 200 volts on the first pulse and then achieve the intended 450 volts on the second pulse. Of course, this solution severely limits the operating speed of the writing head.

A known solution to the switching efficiency problem caused by gate-to-drain parasitic capacitance is the use of a cascode circuit wherein the switching transistor is connected in series with the switched transistor and the gate of the switched transistor is biased to a fixed potential. However, when this solution is applied to an amorphous silicon HVTFT (switched transistor) it triggers an instability in the device which shifts the $I_{DS}$ vs. $V_{DS}$ characteristic curve to the right over time. This instability is characterized by a parameter $V_X$, and the resulting curve is said to be $V_X$ shifted. In FIG. 3, curve A represents an initial (unstressed) condition and curve B represents a $V_X$ shifted condition. This phenomenon occurs when the gate to source voltage ($V_{GS}$) is much below the HVTFT threshold ($V_{TH}$), as would be the case with a hard OFF condition (see FIG. 4). As a consequence, the output low voltage of the HVTFT (note loadline C based upon a pullup resistor 22 of 450 MegΩ crossing the characteristic curves A and B) increases with time (from about 8 volts to about 80 volts), preventing its switching over the entire 450 volt range, and therefore, in the ON state writing gray rather than white. This phenomenon is discussed in copending patent application U.S. Ser. No. 07/366,822 (Yap) filed on June 15, 1989, hereby fully incorporated by reference. The problem is exacerbated as the differential between the OFF state gate voltage and the threshold voltage increases, and no instability occurs at gate voltages just below the threshold of the HVTFT (in the range from about 0.5 to 1 volt).

Another problem exhibited by amorphous silicon transistors is a threshold voltage $V_{TH}$ shift which occurs during normal usage when the device is maintained in its ON state for an extended period of time. As $V_{TH}$ of the HVTFT increases, the normal 0 volt bias on the gate for maintaining the OFF state of the device falls far below $V_{TH}$ and induces the $V_X$ instability.

It is the primary object of the present invention to overcome the switching efficiency problem of an amorphous silicon HVTFT by using an improved cascode circuit which will not only protect the HVTFT from $V_X$ instability but will improve its stability.

SUMMARY OF THE INVENTION

The present invention may be carried out, in one form, by providing a cascode circuit for switching a high voltage thin film transistor substantially over its entire high voltage range, comprising a leaky low voltage thin film transistor connected in series with the high voltage thin film transistor, the transistors being connected between a source of high potential and a source of reference potential. The leaky low voltage thin film transistor comprises a space charge limited current shunt connected in parallel with a low voltage transistor.

BRIEF DESCRIPTION OF THE DRAWINGS

Other objects and further features and advantages of this invention will be apparent from the following, more particular, description considered together with the accompanying drawings, wherein.

DETAILED DESCRIPTION OF THE ILLUSTRATED EMBODIMENTS

Figure 5:
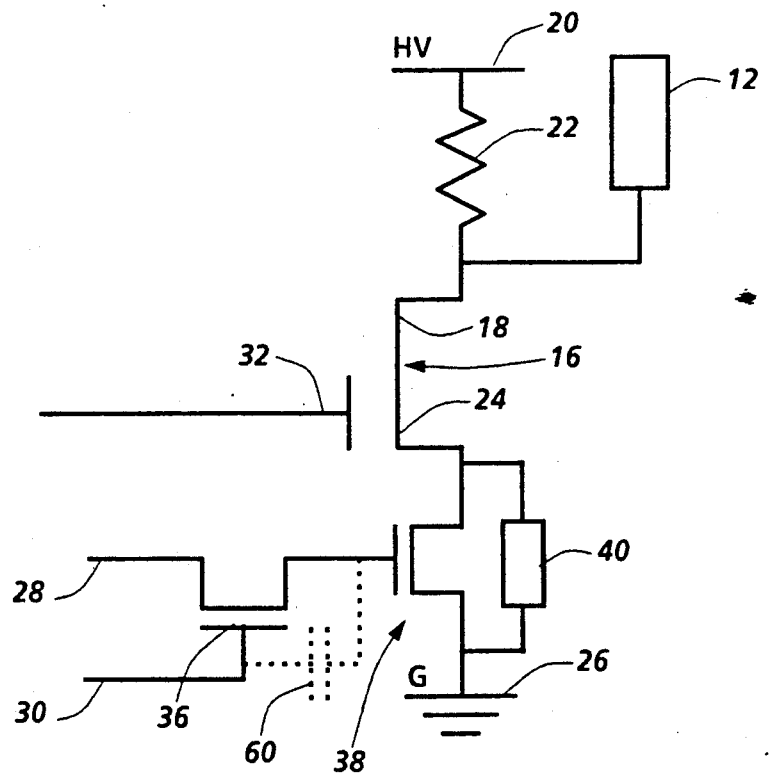
FIG. 5 is a schematic representation of a single cell of the improved cascode drive circuit which is the subject of the present invention.

The cascode circuit illustrated in FIG. 5 solves the switching and reliability problems. It comprises a low voltage thin film pass transistor 36 and a novel low voltage thin film switching transistor 38 for switching the source electrode potential of the HVTFT in order to turn the device ON and OFF while maintaining a fixed potential on the gate electrode 32 of the HVTFT. The floating gate of the switching LVTFT is completely isolated from the large voltage swings of the HVTFT drain, therefore, the switching efficiency problem of that device is eliminated. Additionally, the novel low voltage thin film switching transistor 38 is provided with a space charge limited shunt 40 in parallel with the switching transistor for insuring a leakage path to the reference potential in order to prevent the $V_X$ shift in the HVTFT, as will become apparent hereinafter.

Figure 6:
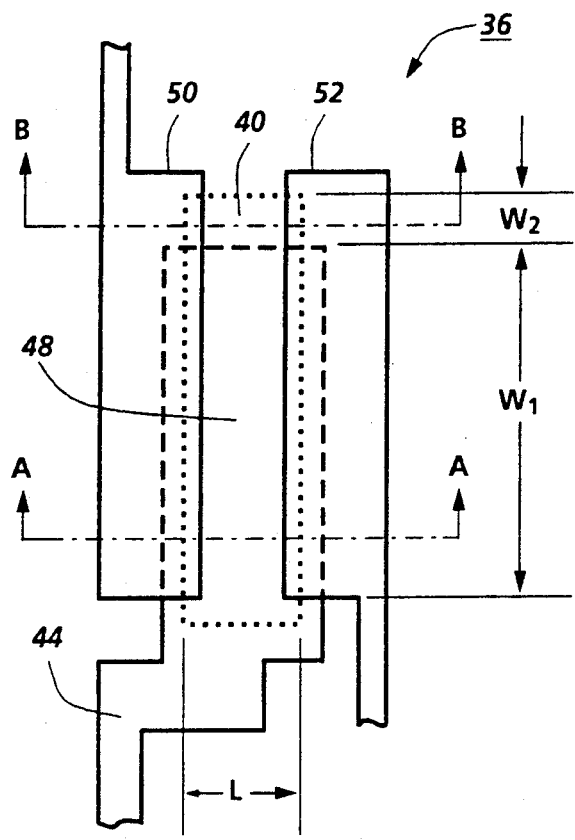
FIG. 6 is a schematic plan view of the improved low voltage thin film transistor with the integral space charge limited parallel current path.
Figure 7A:
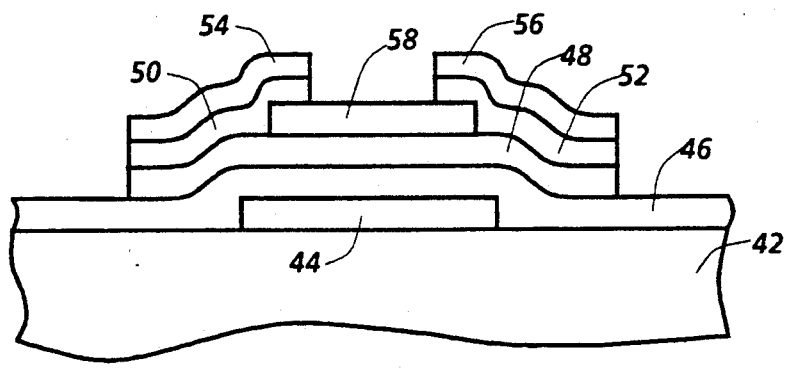
FIGS. 7A and 7B are schematic sectional views taken substantially along lines A—A and B—B of FIG. 6, showing gated and ungated portions of the device.
Figure 7B:
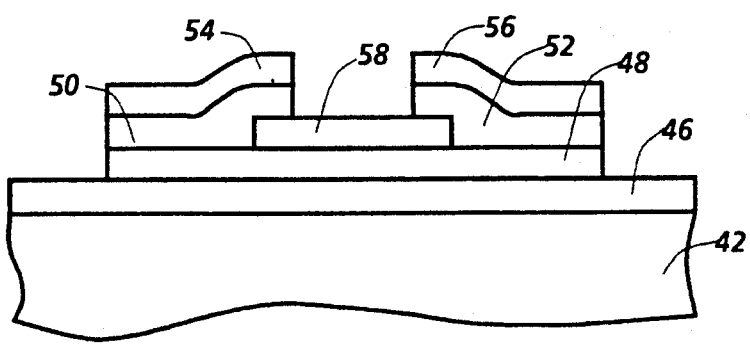

It can be seen in FIGS. 6, 7A and 7B that the novel shunted LVTFT 38 is basically a standard amorphous silicon LVTFT comprising a substrate 42, a conductive gate electrode layer 44, a gate dielectric layer 46, a substantially intrinsic amorphous silicon charge transport layer 48, doped (n+) amorphous silicon source and drain electrodes 50 and 52, conductive source and drain contacts 54 and 56, and top dielectric layer 58. The amorphous silicon layer 48 and the source and drain electrodes 50 and 52 extend beyond the gate electrode 44 in the region of section B—B so that that portion of the amorphous silicon charge transport island is ungated and has a current path parallel to the gated current path through the transistor. Whenever there is a potential drop between the source electrode and the drain electrode, space charge limited current will flow thereacross in the ungated region. A more complete description of this leaky LVTFT is to be found in my copending patent application entitled "Leaky Low Voltage Thin Film Transistor" filed concurrently herewith, identified by Ser. No. 566,015, and assigned to the same assignee, the disclosure of which is fully incorporated herein by reference.

The novel shunted thin film transistor is easily fabricated, requiring no more processing steps than necessary for fabrication of the conventional transistor. The amorphous silicon charge transport island and the source and drain electrodes need merely to be extended beyond the end of the gate electrode.

Figure 1:
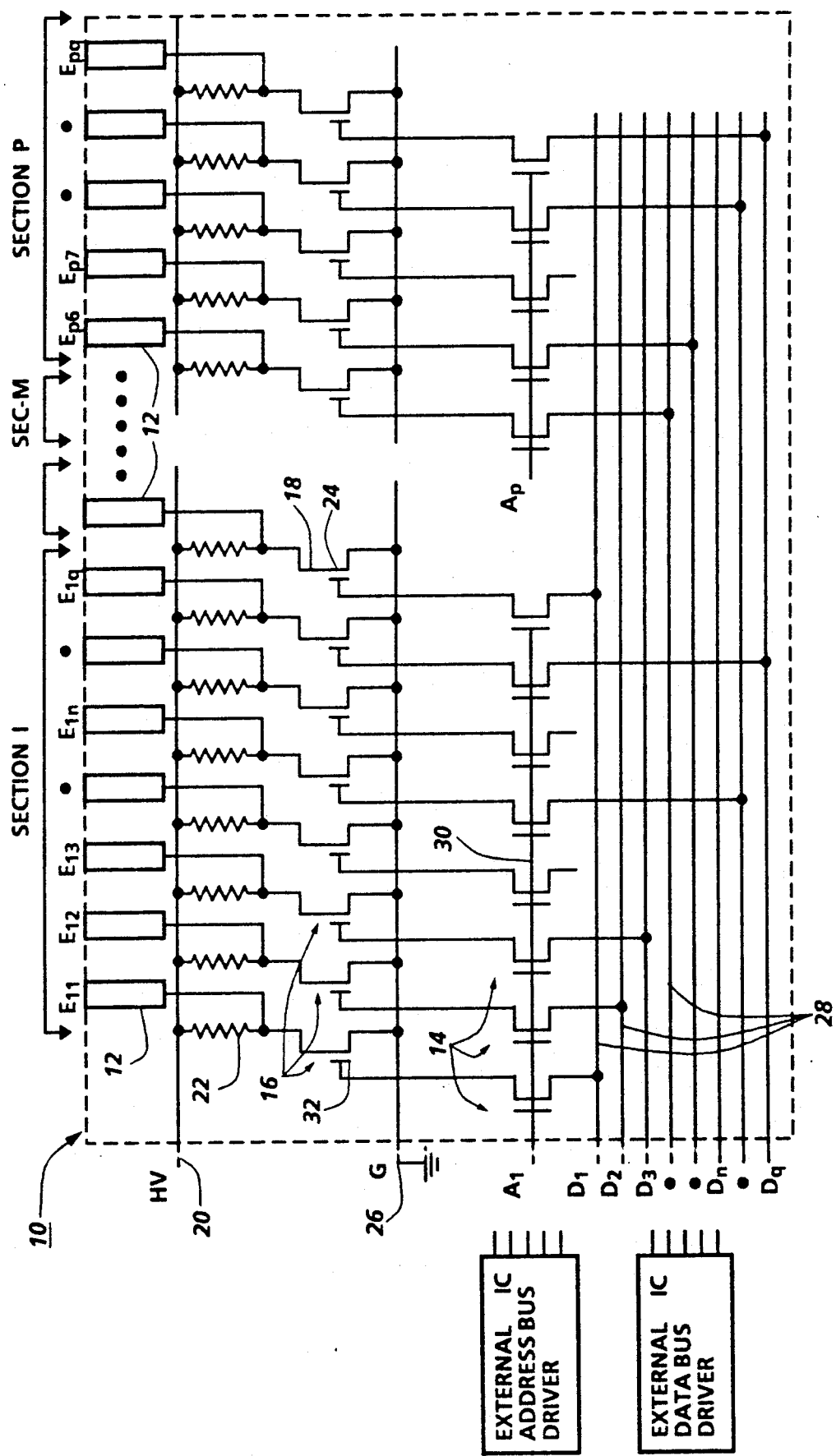
FIG. 1 is a schematic representation of an integral thin film writing head.
Figure 2:
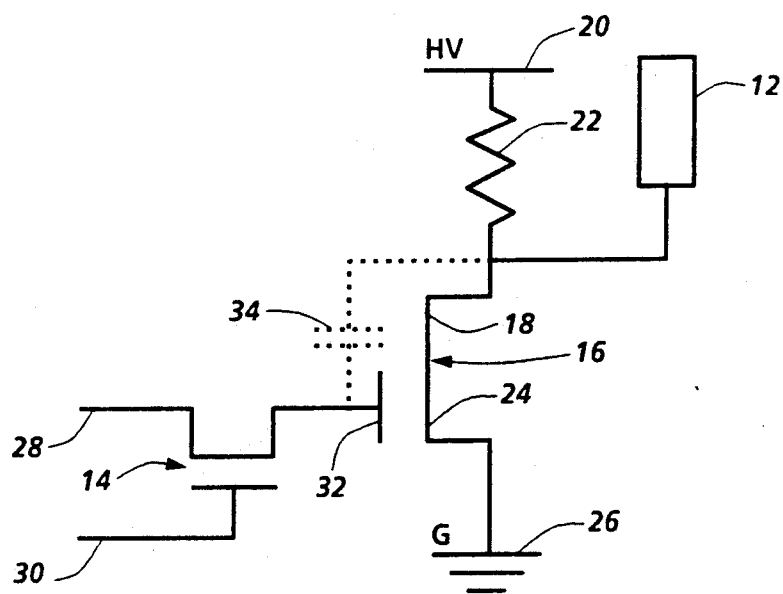
FIG. 2 is a schematic representation of a single cell of the array of FIG. 1.
Figure 3:
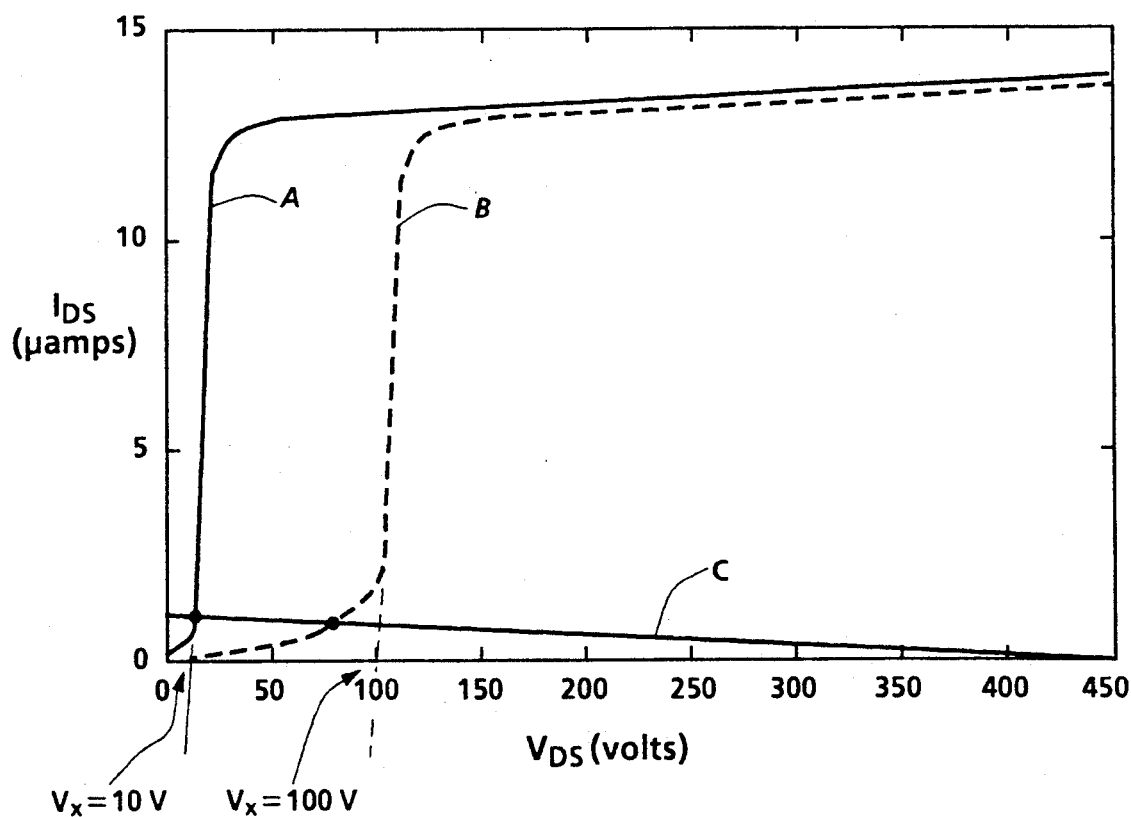
FIG. 3 illustrates characteristic $I_{DS}$ vs. $V_{DS}$ curves of an amorphous silicon HVTFT showing the $V_X$ shift.
Figure 9:
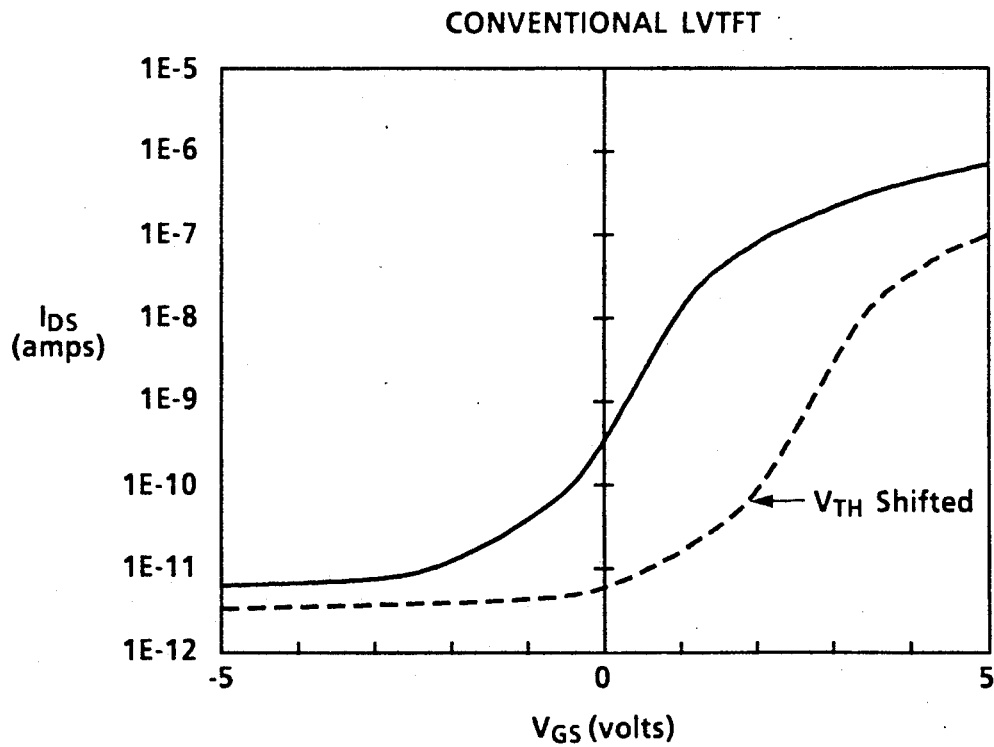
FIG. 9 illustrates characteristic $I_{DS}$ vs. $V_{GS}$ curves of a conventional amorphous silicon LVTFT.

In order to understand the beneficial aspects of the novel shunted thin film transistor, it is important to recognize why the cascode circuit cannot work satisfactorily with standard amorphous silicon transistors. The fundamental concept is that the current through the series connected HVTFT 16 and the switching LVTFT will be identical. This is true not only in the ON state of the LVTFT but also in its OFF state, wherein the leakage current through the devices will be matched. Turning now to a comparison of the HVTFT characteristic $I_{DS}$ vs. $V_{GS}$ curve (for $V_{DS}=450$ volts) of FIG. 4 with a conventional LVTFT characteristic $I_{DS}$ vs. $V_{GS}$ curve (for $V_{DS}=20$ volts) of FIG. 9, it can be seen that when the switching LVTFT is turned OFF by applying, for example, 0 volts to its gate, a leakage current of about $10-9.5$ amps will flow (see FIG. 9). A matching leakage current ($10-9.5$ amps) through the HVTFT in its OFF state will result in a gate voltage ($V_{GS}$) of about $-0.8$ volts (see FIG. 3) or about 2.3 volts below the identified HVTFT threshold voltage ($V_{TH}$) of about 1.5 volts.

The typically higher leakage current through the HVTFT than through the conventional switching LVTFT will always cause the OFF state $V_{GS}$ of the HVTFT to be much below its threshold voltage, thereby inducing a hard OFF condition which results in the $V_X$ shift instability. The rate at which $V_X$ shifts is strongly dependent upon the magnitude of that differential and the length of time that the hard OFF condition exists. If the gate voltage can be maintained just below the threshold voltage of the HVTFT (by about 0.5 volts) degradation will not occur.

Because of the transients in the pass transistor it is not possible to maintain the gate voltage of the switching transistor at 0 volts. When the pass transistor 36 rapidly charges and discharges the gate of the switching transistor 38, parasitic capacitance, as represented by the dotted line capacitor 60, arises between the gate and the drain electrodes of the pass transistor. Thus, when the switching transistor 38 is switched to its OFF state and the gate of the pass transistor 36 is rapidly discharged from 24 volts to 0 volts in order to allow the switching transistor to float at that potential, the parasitic capacitance 60 will pull the gate of the switching transistor down several volts (e.g. −4 volts rather than 0 volts). Comparing the characteristic curves of FIGS. 4 and 9 it can be seen that the leakage current through a fresh, unstressed, LVTFT at −4 volts will be about $10-11.1$ amps and the matching current through the HVTFT will result in $V_{GS}$ of about −5 volts. This is about 6.5 volts below the threshold voltage and will cause deep depletion in the HVTFT, driving it into $V_X$ instability rapidly.

As stated above, the threshold voltage shift phenomenon in amorphous silicon transistors normally aggravates the $V_X$ instability problem in the HVTFT. It can be seen in FIGS. 4 and 9 that as $V_{TH}$ increases, the characteristic $I_{DS}$ vs. $V_{GS}$ curves shift to the right over time and higher gate voltages will be needed to turn the device ON. For example, when the HVTFT device is new, $V_{TH}$ is typically about 1.5 volts. As the device is stressed during usage over time, $V_{TH}$ could rise by 2, 3 or more volts (2 volts illustrated in FIG. 4). A $V_{TH}$ shift in the LVTFT will cause the OFF current at $V_{GS}=0$ volts to drop substantially (from about $10-9.5$ to about $10-11.2$ amps). In a cascode circuit wherein currents through the HVTFT and LVTFT will be matched, this decreased OFF current through the HVTFT will cause $V_{GS}$ to be very much lower than the upwardly shifted threshold voltage. As a result, the HVTFT will undergo further stress and drive the $V_X$ shift further to the right.

Although the cascode circuit solution is well known for overcoming the switching efficiency problem caused by parasitic capacitance, its implementation in amorphous silicon raises the specter of the $V_X$ shift phenomenon. I have found that the stability of the HVTFT may be increased with the introduction of the novel LVTFT 38 having a parallel space charge limited shunt 40. The novel leaky LVTFT not only prevents the $V_X$ shift from occurring in the HVTFT by avoiding a hard OFF state which puts the device into an unstable condition, but actually makes the circuit more stable under all conditions.

The space charge current limited shunt 40 in parallel with the switching transistor will insure that the leaky LVTFT 38 always leaks much more than does the HVTFT 16. Therefore, as the circuit seeks to achieve a state where the leakages through the two series connected transistors match, the gate to source potential of the HVTFT will be prevented from dropping far below its threshold voltage (no greater than about 1 volt less than $V_{TH}$).

Figure 4:
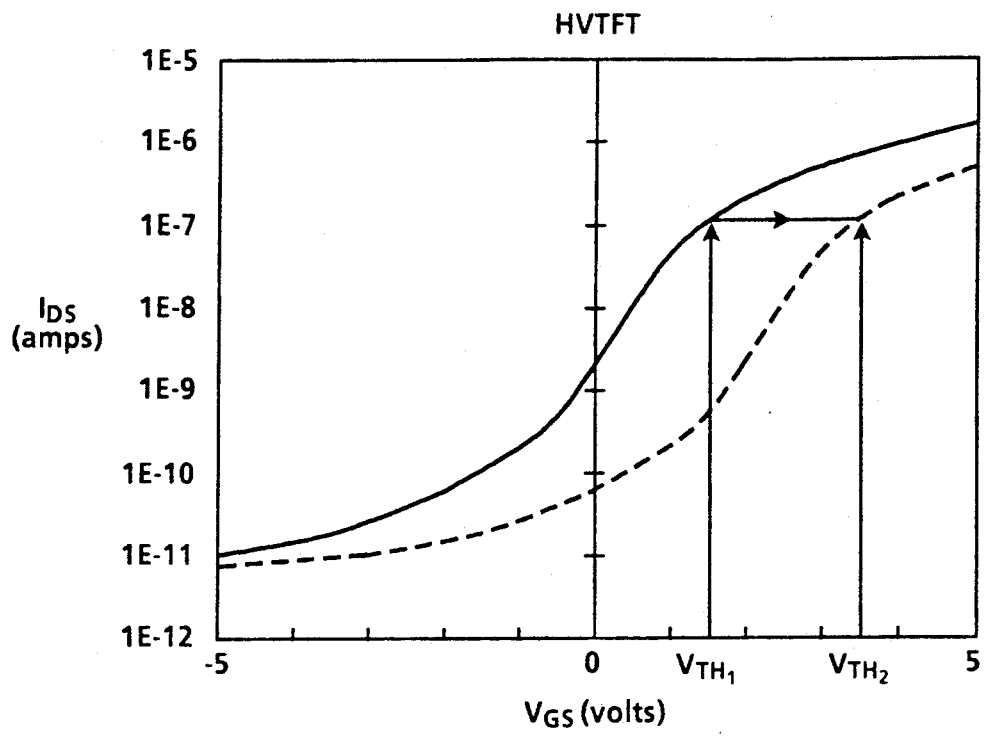
FIG. 4 illustrates characteristic $I_{DS}$ vs. $V_{GS}$ curves of an amorphous silicon HVTFT showing the threshold voltage ($V_{TH}$) shift.
Figure 8:
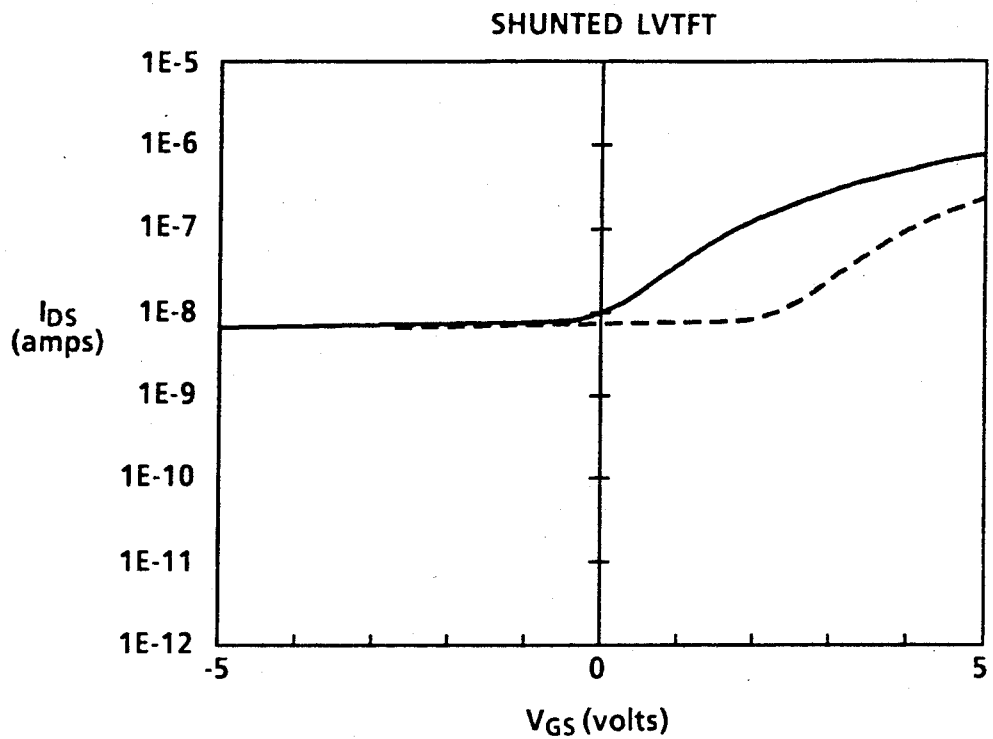
FIG. 8 illustrates characteristics $I_{DS}$ vs. $V_{GS}$ curves of the improved space charge limited shunted LVTFT of FIG. 6.

Turning to FIGS. 4 and 8, it can be seen that when the leaky switching transistor 38 is turned OFF at 0 volts the current flowing through it is about $10-8$ amps. The matching current through the HVTFT 16 will yield a gate potential of about 0.5 volts. Since the gate potential is about 1 volt below its threshold voltage, the $V_X$ shift will be minimized or possibly prevented. As to the effect of parasitic capacitance 60 which drives the gate of the switching transistor to about −4 volts rather than 0 volts, it can be seen in FIG. 8 that the leakage current will remain virtually the same. Similarly, as the novel leaky LVTFT undergoes a threshold voltage shift to the right, over time, the leakage current will remain virtually the same.

The relatively high and flat response at negative gate voltages shown in FIG. 8 indicates that in the OFF state of the leaky LVTFT the shunt prevails and the device will leak more than does the HVTFT. In the ON state, circuit operation will not be affected. The OFF state leakage response of this novel device insures that in the OFF state $V_{GS}$ of the HVTFT is always just below $V_{TH}$ because it shifts upwards, tracking, and thereby adjusting itself to the $V_{TH}$ shift of the HVTFT.

It should be understood that the present disclosure has been made only by way of example and that numerous changes in details of construction and the combination and arrangement of parts may be resorted to without departing from the true spirit and the scope of the invention as hereinafter claimed.

What is claimed is:

1. In a cascode circuit comprising a high voltage thin film transistor and a low voltage thin film transistor connected in series with said high voltage thin film transistor, each of said transistors including a source electrode a drain electrode and a gate electrode, said drain electrode of said high voltage transistor being connected to a source of high potential, said gate electrode of said high voltage transistor being connected to a source of fixed potential, said source electrode of said high voltage transistor being connected to said drain of said low voltage transistor and said source electrode of said low voltage transistor being connected to a source of reference potential, the improvement for switching said high voltage thin film transistor substantially over its entire high voltage range comprising a thin film space charge limited current shunt connected in parallel with said low voltage transistor between said source electrode and said drain electrode of said low voltage transistor.

2. In the cascode circuit as defined in claim 1 the OFF state leakage current of the combination of said low voltage transistor and said thin film space charge limited current shunt is greater than the OFF state leakage current of said high voltage thin film transistor.

3. In the cascode circuit as defined in claim 1 said transistors and said shunt are made of amorphous silicon.

4. In the cascode circuit as defined in claim 1 in the OFF state of said transistors, the gate electrode to source electrode bias of said high voltage transistor is no greater than two volts below the threshold voltage of said high voltage transistor.

5. In the cascode circuit as defined in claim 1 said low voltage transistor and said space charge limited shunt comprises a single device.

6. In the cascode circuit as defined in claim 5 said single device comprises an amorphous silicon charge transport layer, laterally spaced source and drain electrodes in contact with said charge transport layer, a gate electrode spaced from said charge transport layer by a gate dielectric layer, and said single device includes a first portion in which said gate electrode extends laterally from said source electrode to said drain electrode, and a second portion in which there is no gate electrode extending laterally from said source electrode to said drain electrode, whereby an ungated electrical path is provided between said source electrode and said drain electrode in parallel with a gated path between said source and drain electrodes.

7. In a cascode circuit comprising a high voltage thin film transistor and a leaky low voltage thin film transistor connected in series with said high voltage thin film transistor, said transistors being connected between a source of high potential and a source of reference potential, the improvement for switching said high voltage thin film transistor substantially over its entire high voltage range comprising a thin film space charge limited current shunt connected in parallel with said low voltage thin film transistor.

8. In the cascode circuit as defined in claim 7 the OFF state leakage current of said leaky low voltage thin film transistor is greater than the OFF state leakage current of said high voltage thin film transistor.

9. In the cascode circuit as defined in claim 7 said transistors and said shunt are made of amorphous silicon.

10. In the cascode circuit as defined in claim 7 said leaky low voltage thin film transistor comprises a single device.

* * * * *